United States Patent
Li et al.

(10) Patent No.: US 11,723,252 B2
(45) Date of Patent: Aug. 8, 2023

(54) ORGANIC LIGHT-EMITTING DISPLAY SUBSTRATE AND DISPLAY DEVICE

(71) Applicant: BOE TECHNOLOGY GROUP CO., LTD., Beijing (CN)

(72) Inventors: Zhenzhen Li, Beijing (CN); Lujiang Huangfu, Beijing (CN); Yue Liu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 310 days.

(21) Appl. No.: 17/289,130

(22) PCT Filed: Sep. 29, 2020

(86) PCT No.: PCT/CN2020/118948
§ 371 (c)(1),
(2) Date: Apr. 27, 2021

(87) PCT Pub. No.: WO2021/093481
PCT Pub. Date: May 20, 2021

(65) Prior Publication Data
US 2022/0310707 A1     Sep. 29, 2022

(30) Foreign Application Priority Data

Nov. 13, 2019   (CN) .......................... 201911104421.8

(51) Int. Cl.
*H01L 27/32*      (2006.01)
*H01L 51/56*      (2006.01)
(Continued)

(52) U.S. Cl.
CPC ........... *H10K 59/353* (2023.02); *H10K 71/00* (2023.02); *H10K 59/352* (2023.02)

(58) Field of Classification Search
CPC ..................... H10K 59/352; H10K 59/35–353
See application file for complete search history.

(56) References Cited

U.S. PATENT DOCUMENTS 10,854,684 B2 * 12/2020 Huangfu ............ H10K 50/8428
11,233,096 B2 *  1/2022 Huangfu ........... G02F 1/133514
(Continued)

FOREIGN PATENT DOCUMENTS

| CN | 204614789 A | * | 9/2015 | ............ H01L 27/32 |
| CN | 204614789 U |   | 9/2015 | |

(Continued)

OTHER PUBLICATIONS

International Searching Authority, Translation—International Search Report, International application No. PCT/CN2020/118948, dated Jan. 4, 2021, all pages. (Year: 2021).*

(Continued)

*Primary Examiner* — Victoria K. Hall
(74) *Attorney, Agent, or Firm* — The Webb Law Firm

(57) ABSTRACT

The present disclosure relates to an organic light-emitting display substrate and a display device. The organic light-emitting display substrate includes a plurality of rows of sub-pixels, each of which includes first sub-pixels, second sub-pixels and third sub-pixels repeatedly arranged, and two adjacent rows of sub-pixels are arranged in a staggered manner, in every two adjacent rows of sub-pixels: a first sub-pixel in one row of sub-pixels and a second sub-pixel and a third sub-pixel that are adjacent to the first sub-pixel in the other row of sub-pixels, form a pixel unit, and white light brightness centers of the pixel units in a same row are located on a same straight line.

19 Claims, 7 Drawing Sheets

(51) Int. Cl.
    *H10K 59/35*     (2023.01)
    *H10K 71/00*     (2023.01)

(56) References Cited

U.S. PATENT DOCUMENTS

| | | | | |
|---|---|---|---|---|
| 11,574,960 | B2 * | 2/2023 | Wang | H10K 59/352 |
| 2016/0204094 | A1 * | 7/2016 | Yang | H10K 59/353 257/773 |
| 2019/0011830 | A1 * | 1/2019 | Ji | H10K 59/351 |
| 2019/0140030 | A1 * | 5/2019 | Huangfu | G09G 3/3225 |

FOREIGN PATENT DOCUMENTS

| | | | | | |
|---|---|---|---|---|---|
| CN | 105096766 | A | * | 11/2015 | G09F 9/33 |
| CN | 105096766 | A | | 11/2015 | |
| CN | 105137641 | A | * | 12/2015 | G02F 1/133514 |
| CN | 105137641 | A | | 12/2015 | G02F 1/133514 |
| CN | 105185247 | A | * | 12/2015 | G02F 1/134309 |
| CN | 204926686 | U | * | 12/2015 | G09F 9/00 |
| CN | 204926686 | U | | 12/2015 | |
| CN | 208062054 | U | * | 11/2018 | H01L 27/32 |
| CN | 208062054 | U | | 11/2018 | |
| CN | 110364557 | A | * | 10/2019 | H10K 59/352 |
| CN | 110364557 | A | | 10/2019 | |
| CN | 110707141 | A | | 1/2020 | |
| CN | 113437233 | A | * | 9/2021 | H10K 50/80 |

OTHER PUBLICATIONS

International Searching Authority, Translation—Written Opinion of the International Searching Authority, International application No. PCT/CN2020/118948, dated Jan. 4, 2021, all pages. (Year: 2021).*
Machine translation, He, Chinese Pat. Pub. No. CN105185247A, translation date: Apr. 18, 2023, Clarivate Analytics, all pages. (Year: 2023).*
Machine translation, Ji, Chinese Pat. Pub. No. CN204614789U, translation date: Apr. 14, 2023, Espacenet, all pages. (Year: 2023).*
Machine translation, Liu, Chinese Pat. Pub. No. CN113437233A, translation date: Apr. 18, 2023, Clarivate Analytics, all pages. (Year: 2023).*
Machine translation, Ma, Chinese Pat. Pub. No. CN208062054U, translation date: Apr. 14, 2023, Espacenet, all pages. (Year: 2023).*
Machine translation, Yang, Chinese Pat. Pub. No. CN110364557A, translation date: Apr. 14, 2023, Espacenet, all pages. (Year: 2023).*
Machine translation, Zhang, Chinese Pat. Pub. No. CN1105096766B, translation date: Apr. 14, 2023, Espacenet, all pages. (Year: 2023).*
Machine translation, Zhang, Chinese Pat. Pub. No. CN105137642A, translation date: Apr. 18, 2023, Clarivate Analytics, all pages. (Year: 2023).*
Machine translation, Hu, Chinese Pat. Pub. No. CN204926686U, translation date: Apr. 14, 2023, Espacenet, all pages. (Year: 2023).*
Machine translation, Hu, Chinese Pat. Pub. No. CN105137641A, translation date: Apr. 18, 2023, Clarivate Analytics, all pages. (Year: 2023).*

* cited by examiner

ORGANIC LIGHT-EMITTING DISPLAY SUBSTRATE AND DISPLAY DEVICE

CROSS-REFERENCE TO RELATED APPLICATIONS

This application is a U.S. National Stage Application under 35 U.S.C. § 371 of International Patent Application No. PCT/CN2020/118948, filed Sep. 29, 2020, which is based on and claims the priority to the Chinese Patent Application No. 201911104421.8, filed on Nov. 13, 2019, the disclosures of which are incorporated hereby as a whole into the present application.

TECHNICAL FIELD

The present disclosure relates to the technical field of display, and in particular, to an organic light-emitting display substrate and a display device.

BACKGROUND

Organic light-emitting display devices are marked as the next generation display technology with great development prospects due to their advantages of lightness, thinness, flexibility, low power consumption, wide color gamut, high contrast, and the like. How to improve display quality of the organic light-emitting display devices has always been a focus developed by those skilled in the art. The above is only for assistance in understanding the technical solutions of the present disclosure, and does not represent an admission that the above is prior art.

SUMMARY

According to an aspect of the embodiments of the present disclosure, there is provided an organic light-emitting display substrate comprising a plurality of rows of sub-pixels each of which comprises first sub-pixels, second sub-pixels and third sub-pixels repeatedly arranged, and two adjacent rows of sub-pixels are arranged in a staggered manner, in every two adjacent rows of sub-pixels:

a first sub-pixel in one row of sub-pixels, and a second sub-pixel and a third sub-pixel adjacent to the first sub-pixel in the other row of sub-pixels, form a pixel unit, and white light brightness centers of the pixel units in a same row are located on a same straight line.

In some embodiments, the first sub-pixels are green light sub-pixels, the second sub-pixels are red light sub-pixels, and the third sub-pixels are blue light sub-pixels.

In some embodiments, connection lines between a brightness center of the first sub-pixel, a brightness center of the second sub-pixel and a brightness center of the third sub-pixel is in a shape of an isosceles triangle, and the brightness center of the first sub-pixel is located at a vertex angle vertex of the isosceles triangle, the brightness center of the second sub-pixel and the brightness center of the third sub-pixel are respectively located at two base angle vertexes of the isosceles triangle, and a vertex angle of the isosceles triangle is greater than 60°.

In some embodiments, areas of the first sub-pixel, the second sub-pixel, and the third sub-pixel are equal.

In some embodiments, an orthographic projection length of the first sub-pixels in a row direction is greater than that in a column direction, an orthographic projection length of the second sub-pixels in the row direction is equal to that in the column direction, and an orthographic projection length of the third sub-pixels in the row direction is equal to that in the column direction.

In some embodiments, an area $S_G$ of the first sub-pixel, an area $S_R$ of the second sub-pixel, and an area $S_B$ of the third sub-pixel satisfy: $S_B > S_R > S_G$.

In some embodiments, an orthographic projection length of the first sub-pixel in a row direction is greater than that in a column direction, an orthographic projection length of the second sub-pixel in the row direction is equal to that in the column direction, and an orthographic projection length of the third sub-pixel in the row direction is less than that in the column direction.

In some embodiments, a shape of the sub-pixels comprises a rectangle, diamond, or hexagon.

In some embodiments, organic light-emitting layers of the first sub-pixels, the second sub-pixels and the third sub-pixels are separately prepared by mask evaporation, each sub-pixel and its corresponding organic light-emitting layer have a same shape and their geometric centers coincide, and an edge of each sub-pixel is located inside an edge of its corresponding organic light-emitting layer.

According to another aspect of the embodiments of the present disclosure, there is provided a display device comprising the organic light-emitting display substrate according to any of the foregoing technical solutions.

Other features of the present disclosure and advantages thereof will become apparent from the following detailed description of the embodiments of the present disclosure with reference to the accompanying drawings.

BRIEF DESCRIPTION OF THE DRAWINGS

The accompanying drawings, which constitute a part of this specification, illustrate the embodiments of the present disclosure and, together with the description, serve to explain the principles of the present disclosure.

The present disclosure will be understood more clearly according to the following detailed description with reference to the accompanying drawings, in which.

It should be understood that sizes of various portions shown in the accompanying drawings are not drawn to actual scale. Furthermore, identical or similar reference numerals denote identical or similar members.

DETAILED DESCRIPTION

Various exemplary embodiments of the present disclosure will be described in detail with reference to the accompanying drawings in the following. The following description of the exemplary embodiments is merely illustrative in nature and is in no way intended to limit this disclosure, its application, or uses. The present disclosure may be implemented in many different forms and is not limited to the embodiments described herein. These embodiments are provided merely for making the present disclosure thorough and complete, and sufficiently expressing the scope of the present disclosure to one of ordinary skill in the art. It should be noted that the relative arrangement of the components and steps, compositions of materials, the numerical expressions, and numerical values set forth in these embodiments are interpreted to be merely illustrative instead of restrictive, unless it is specifically stated otherwise.

The words "first", "second" and the like used in the present disclosure do not imply any sequence, number or importance, but are merely used to distinguishing different portions. The word "comprise" or "include" or the like means that an element preceding the word covers elements listed following the word, but does not preclude the possibility of covering also other elements. The terms "up", "down", "left", "right" and the like are merely used for implying relative position relations, and after an absolute position of the object described changes, the relative position relation may possibly change correspondingly.

In this disclosure, when a specific device is described between a first device and a second device, an intermediate device may exist between the specific device and the first device or the second device, or an intermediate device may not exist. When a specific device is described to be connected to another device, the specific device may be directly connected with the another device without an intermediate device, or it may not be directly connected with the another device but has an intermediate device.

All terms (including technical or scientific terms) used in this disclosure have the same meanings as understood by one of ordinary skill in the art, unless otherwise specifically defined. It should also be understood that the terms defined in common dictionaries should be interpreted as having meanings consistent with their meanings in the context of the relevant technologies, but should not be interpreted with idealized or extremely formalized meanings, unless otherwise expressly defined herein.

Techniques, methods and apparatuses as known by one of ordinary skill in the relevant art may not be discussed in detail, but are intended to be regarded as a part of the specification where appropriate.

Figure 1:
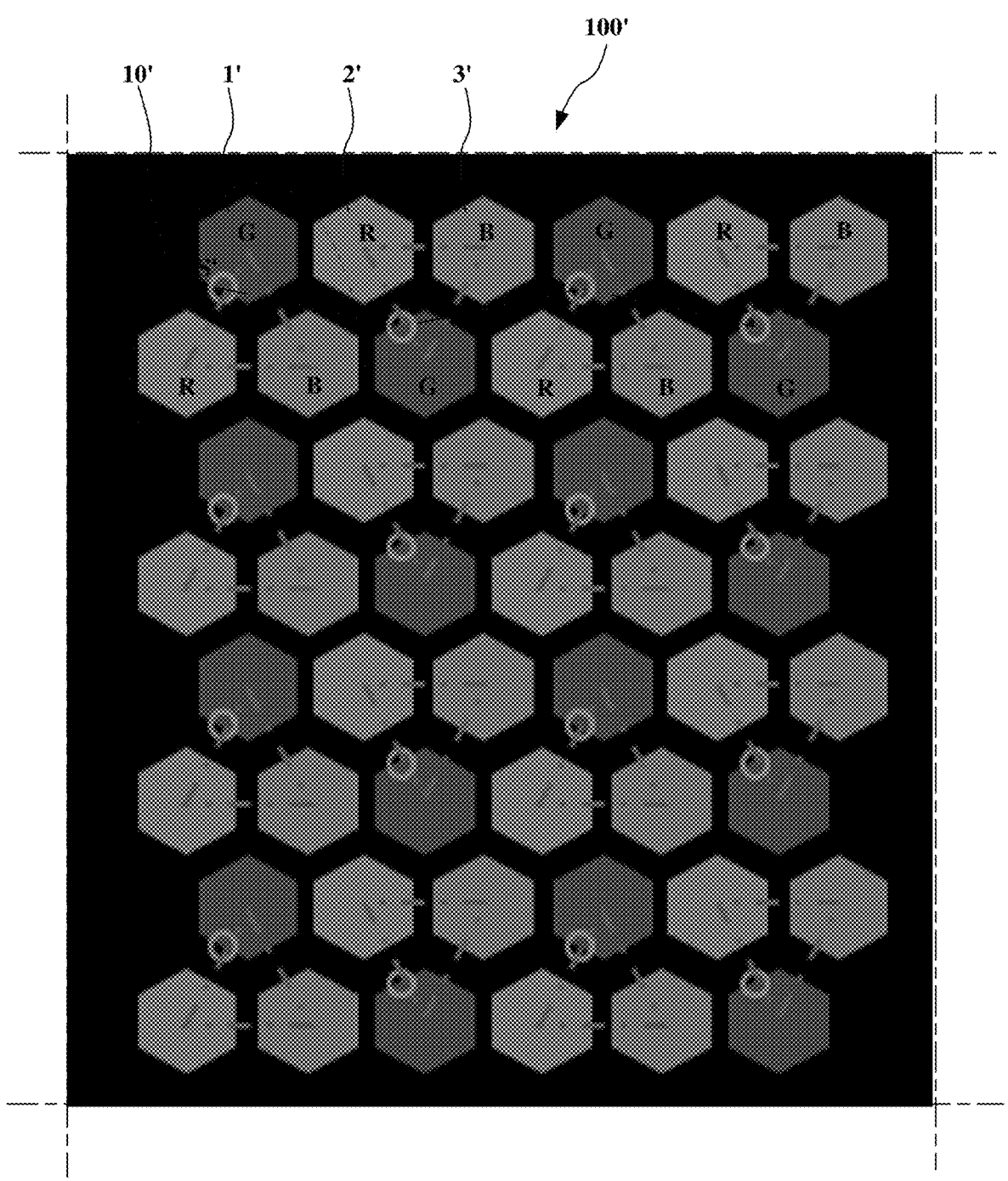
FIG. 1 is a schematic view illustrating a sub-pixel arrangement of an organic light-emitting display substrate in the related art.

FIG. 1 is a schematic view illustrating a sub-pixel arrangement of an organic light-emitting display substrate in the related art. The organic light-emitting display substrate 100' comprises a plurality of rows of sub-pixels, each of which comprises green light sub-pixels 1', red light sub-pixels 2' and blue light sub-pixels 3' circularly arranged, two adjacent rows of sub-pixels are arranged in a staggered manner, in every two adjacent rows of sub-pixels, a green light sub-pixel 1' in one row of sub-pixels, and a red light sub-pixel 2' and a blue light sub-pixel 3' adjacent to the green light sub-pixel in the other row of sub-pixels, form a pixel unit 10', and in the pixel unit 10', a brightness center of the green light sub-pixel 1', a brightness center of the red light sub-pixel 2' and a brightness center of the blue light sub-pixel 3' are respectively located at vertexes of an equilateral triangle. This arrangement is commonly known as a Delta arrangement.

The inventors of the present disclosure have found in the process of implementing the embodiments of the present disclosure that, when a white pattern is displayed on a display device including the organic light-emitting display substrate described above, the pattern obviously has a serrated edge, and display quality is unsatisfactory.

In order to solve the above technical problems, the embodiments of the present disclosure provide an organic light-emitting display substrate and a display device.

Figure 2A:
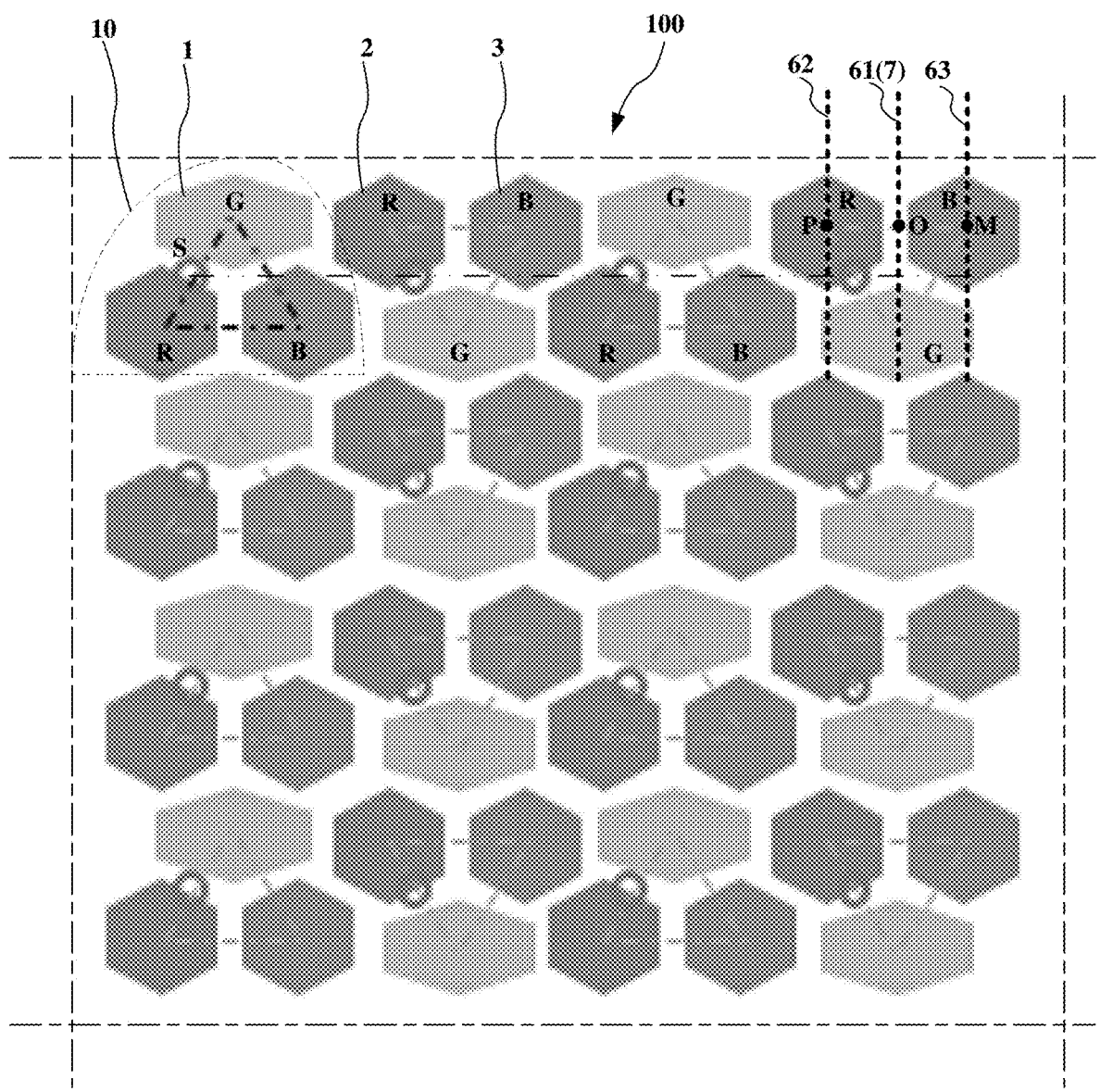
FIG. 2a is a schematic view illustrating a sub-pixel arrangement of an organic light-emitting display substrate according to an embodiment of the present disclosure.

FIG. 2a is a schematic view illustrating a sub-pixel arrangement of an organic light-emitting display substrate according to an embodiment of the disclosure.

As shown in FIG. 2a, the organic light-emitting display substrate 100 of the embodiment of the present disclosure comprises a plurality of rows of sub-pixels. Each row of sub-pixels comprises first sub-pixels 1, second sub-pixels 2, and third sub-pixels 3 repeatedly arranged. Any two adjacent rows of sub-pixels in the plurality of rows of sub-pixels are arranged in a staggered manner. In each of two adjacent rows of sub-pixels: a first sub-pixel 1 in one row of sub-pixels and two sub-pixels adjacent to the first sub-pixel 1 in the other row of sub-pixels form a pixel unit 10, the two sub-pixels include a second sub-pixel 2 and a third sub-pixel 3, and as shown by a two-dot dash line in the figure, white light brightness centers (as shown at a circle S in the figure) of the pixel units 10 in a same row are located on a same straight line.

In some embodiments, any two adjacent rows of sub-pixels in the plurality of rows of sub-pixels are arranged in a staggered manner, and as shown in FIG. 2a, a longitudinal centerline 61 of the first sub-pixel 1, a longitudinal centerline 62 of the second sub-pixel 2 and a longitudinal centerline 63 of the third sub-pixel 3 do not coincide with each other. And there is a non-overlapping portion between an orthographic projection of the first sub-pixel 1 in a row direction and an orthographic projection of the second sub-pixel 2 in the row direction, and a non-overlapping portion between the orthographic projection of the first sub-pixel 1 in the row direction and an orthographic projection of the third sub-pixel 3 in the row direction. The row direction herein can also be understood as an extending direction of the first sub-pixels 1, the second sub-pixels 2, and the third sub-pixels 3 that are repeatedly arranged in each row of sub-pixels.

In some embodiments, the longitudinal centerline 61 of the first sub-pixel 1 coincides with a center vertical line 7 of a line segment (having a center O) between a center P of the second sub-pixel 2 and a center M of the third sub-pixel 3, as shown in FIG. 2a.

Figure 2B:
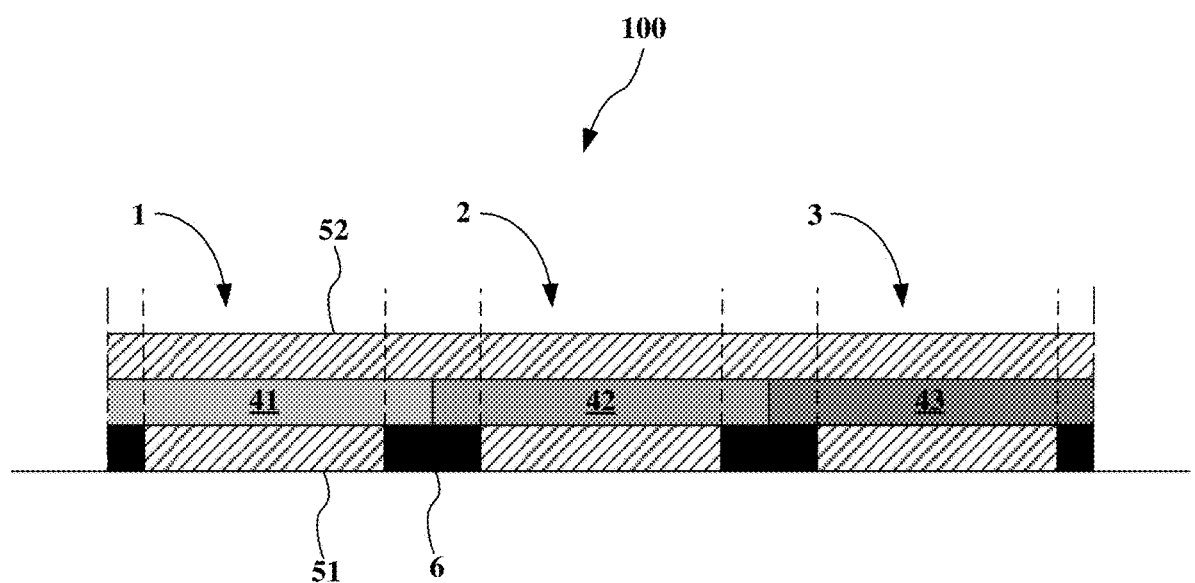
FIG. 2b is a schematic cross-sectional view of a portion of an organic light-emitting display substrate.

Each sub-pixel of the organic light-emitting display substrate is an effective light-emitting portion of an OLED (Organic Light-Emitting Diode) device. As shown in FIG. 2b, the main structure of the OLED device can include an anode 51, an organic light-emitting layer (e.g., an organic light-emitting layer 41), and a cathode 52, which are arranged in this order. The anodes 51 of the OLED devices are spaced apart by a pixel definition layer 6. The cathodes 52 of the OLED devices or the cathodes 52 of some of the OLED devices are connected as a whole to have an equal potential. When an electric field is established between the anode 51 and the cathode 52, visible light is emitted from a portion of an organic light-emitting layer in the electric field. Light with different colors can be emitted from corresponding organic light-emitting layers of the first sub-pixels 1, the second sub-pixels 2 and the third sub-pixels 3.

In the embodiment of the present disclosure, emission colors of the first sub-pixel 1, the second sub-pixel 2, and the third sub-pixel 3 can be different from each other, and their respective emission colors cannot be limited to specific ones. For example, the first sub-pixels 1 can be green light sub-pixels, the second sub-pixels 2 can be red light sub-pixels, the third sub-pixels 3 can be blue light sub-pixels, and the green light sub-pixels, the red light sub-pixels, and the blue light sub-pixels are repeatedly arranged along a row direction. Alternatively, in some embodiments, the first sub-pixels can be green light sub-pixels, the second sub-pixels can be blue light sub-pixels, the third sub-pixels can be red light sub-pixels, and the green light sub-pixels, the blue light sub-pixels, and the red light sub-pixels are repeatedly arranged along the row direction.

Light mixing of the sub-pixels of the pixel unit 10 according to a certain brightness ratio can enable the pixel unit 10 to display various colors visible to human eyes. For example, when light mixing of the red light sub-pixel, the green light sub-pixel, and the blue light sub-pixel of the pixel unit 10 according to the brightness ratio of 65%:30%:5% is performed, the pixel unit 10 can overall exhibit white light. For the sub-pixel, its geometric center is a brightness center. For the pixel unit 10, a position with maximum white light brightness (as shown at a circle S in the figure) is a white light brightness center. For example, the white light brightness center can be located on a connection line between a brightness center of the red light sub-pixel and a brightness center of the green light sub-pixel in the pixel unit 10.

In the related art, as shown in FIG. 1, connection lines between a brightness center of the green light sub-pixel 1', a brightness center of the red light sub-pixel 2', and a brightness center of the blue light sub-pixel 3' are in a shape of an equilateral triangle, the brightness center of the green light sub-pixel 1', the brightness center of the red light sub-pixel 2', and the brightness center of the blue light sub-pixel 3' are respectively located at three vertexes of the equilateral triangle, areas of the green light sub-pixel 1', the red light sub-pixel 2', and the blue light sub-pixel 3' are equal, and the white light brightness center is approximately located at one-third of the connection line between the brightness center of the green light sub-pixel 1' and the brightness center of the red light sub-pixel 2', and is closer to the brightness center of the green light sub-pixel 1'. As shown by a two-dot dash line in the figure, if the white light brightness centers (as shown at a circle S' in the figure) of each row of pixel units 10' are connected to form lines, the connection lines are in a fold line waveform, so that when a white pattern is displayed on a display device comprising the organic light-emitting display substrate 100', the pattern obviously has a serrated edge, and display quality is unsatisfactory.

In the above embodiment of the present disclosure, as shown in FIG. 2a, by designing the shape and/or size of each sub-pixel in the pixel unit 10, the white light brightness centers of the pixel units 10 in a same row are located on a same straight line, so that when a white pattern is displayed on the display device, the serrated edge of the pattern is effectively improved, and display quality of the display device is improved.

It should be noted that, the white light brightness centers of the pixel units 10 in the same row are located on a same straight line, which is allowed to fluctuate within a reasonable error range, and should not be absolutely understood.

As shown in FIG. 2a, in an embodiment of the present disclosure, the first sub-pixel 1 can be a green light sub-pixel, the second sub-pixel 2 can be a red light sub-pixel, and the third sub-pixel 3 can be a blue light sub-pixel. Connection lines between the brightness center of the first sub-pixel 1, the brightness center of the second sub-pixel 2 and the brightness center of the third sub-pixel 3 are in a shape of an isosceles triangle, and the brightness center of the first sub-pixel 1 is located at a vertex angle vertex of the isosceles triangle, the brightness center of the second sub-pixel 2 and the brightness center of the third sub-pixel 3 are respectively located at two base angle vertexes of the isosceles triangle, and a vertex angle of the isosceles triangle is greater than 60°. The white light brightness center of the pixel unit 10 is approximately located at a midpoint of the connection line between the brightness center of the first sub-pixel 1 and the brightness center of the second sub-pixel 2.

Compared with the related art, a distance between the brightness center of the green light sub-pixel and the brightness center of the red light sub-pixel is shortened in the embodiment, so that white light brightness centers of the pixel units in the same row are located on a same straight line (as shown by a two-dot dash line in the figure), and the white light brightness centers are uniformly distributed in a row direction and a column direction, which can effectively improve the serrated edge of a white pattern when the pattern is displayed on the display device.

In this embodiment, areas of the first sub-pixel 1, the second sub-pixel 2, and the third sub-pixel 3 can be equal, that is, an aperture ratio is 1:1:1. A specific shape of the sub-pixels is not limited, and can be, for example, a rectangle, diamond, or hexagon as shown in the figure, etc.

With respect to a specific size design, as shown in FIG. 2a, an orthographic projection length of the first sub-pixel 1 in the row direction can be greater than that in the column direction (e.g., a slightly wide and flat hexagon shown in the figure), an orthographic projection length of the second sub-pixel 2 in the row direction can be equal to that in the column direction (e.g., a regular hexagon shown in the figure), and an orthographic projection length of the third sub-pixel 3 in the row direction can be equal to that in the column direction (e.g., a regular hexagon shown in the figure).

In the case of equal areas, a service life of the blue light sub-pixel is the shortest, and a service life of the red light sub-pixel is slightly shorter than that of the green light sub-pixel. In some embodiments of the present disclosure, in a pixel unit, an area of the blue light sub-pixel can be designed to be the largest among the three, and an area of the green light sub-pixel can be equal to or slightly smaller than that of the red light sub-pixel. In this way, a current density of the blue light sub-pixel can be reduced, and its fading rate can be lessened, so that a service life of the blue light sub-pixel is matched with those of the red light sub-pixel and the green light sub-pixel.

Figure 3A:
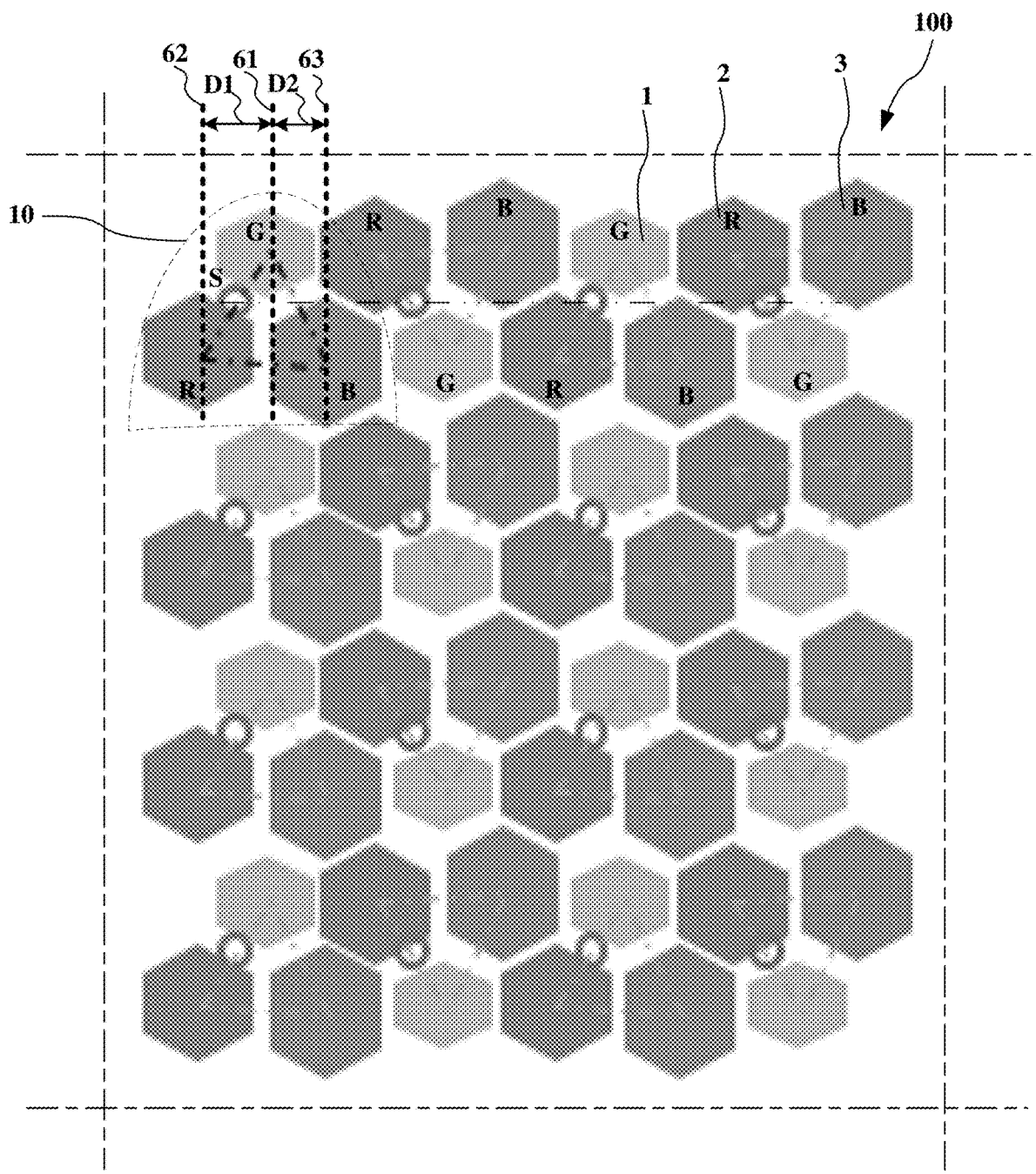
FIG. 3a is a schematic view illustrating a sub-pixel arrangement of an organic light-emitting display substrate according to another embodiment of the present disclosure.

FIG. 3a is a schematic view illustrating a sub-pixel arrangement of an organic light-emitting display substrate according to another embodiment of the disclosure.

As shown in FIG. 3a, in another embodiment of the present disclosure, the first sub-pixel 1 can be a green light sub-pixel, the second sub-pixel 2 can be a red light sub-pixel, the third sub-pixel 3 can be a blue light sub-pixel, and an area $S_G$ of the first sub-pixel 1, an area $S_R$ of the second sub-pixel 2, and an area $S_B$ of the third sub-pixel 3 can satisfy: $S_B > S_R > S_G$.

In some embodiments, a distance D1 between a longitudinal centerline 61 of the first sub-pixel 1 and a longitudinal centerline 62 of the second sub-pixel 2 is different from a distance D2 between the longitudinal centerline 61 of the first sub-pixel 1 and a longitudinal centerline 63 of the third sub-pixel 3. For example, as shown in FIG. 3a, a distance D1 between the longitudinal centerline 61 of the first sub-pixel 1 and the longitudinal centerline 62 of the second sub-pixel 2 is greater than a distance D2 between the longitudinal centerline 61 of the first sub-pixel 1 and the longitudinal centerline 63 of the third sub-pixel 3.

On the premise that the above area condition is satisfied, the pixel unit 10 can be, in terms of specific size design, for example: an orthographic projection length of the first sub-pixel 1 in the row direction is greater than that in the column direction (e.g., a slightly wide and flat hexagon as shown in the figure), an orthographic projection length of the second sub-pixel 2 in the row direction is equal to that in the column direction (e.g., a regular hexagon as shown in the figure), and an orthographic projection length of the third sub-pixel 3 in the row direction is less than that in the column direction (e.g., a slightly narrow and long hexagon as shown in the figure). The white light brightness center of the pixel unit 10 is approximately located at a midpoint of a connection line between the brightness center of the first sub-pixel 1 and the brightness center of the second sub-pixel 2.

Compared with the related art, the embodiment, on one hand, shortens a distance between the brightness center of the green light sub-pixel and the brightness center of the red light sub-pixel, so that white light brightness centers of the pixel units in a same row are located on a same straight line, which effectively improves the serrated edge of the white pattern when the pattern is displayed on the display device; and on the other hand, a service life of the blue light sub-pixel is matched with those of the red light sub-pixel and the green light sub-pixel, so that a service life of the organic light-emitting display substrate is prolonged.

Figure 2C:
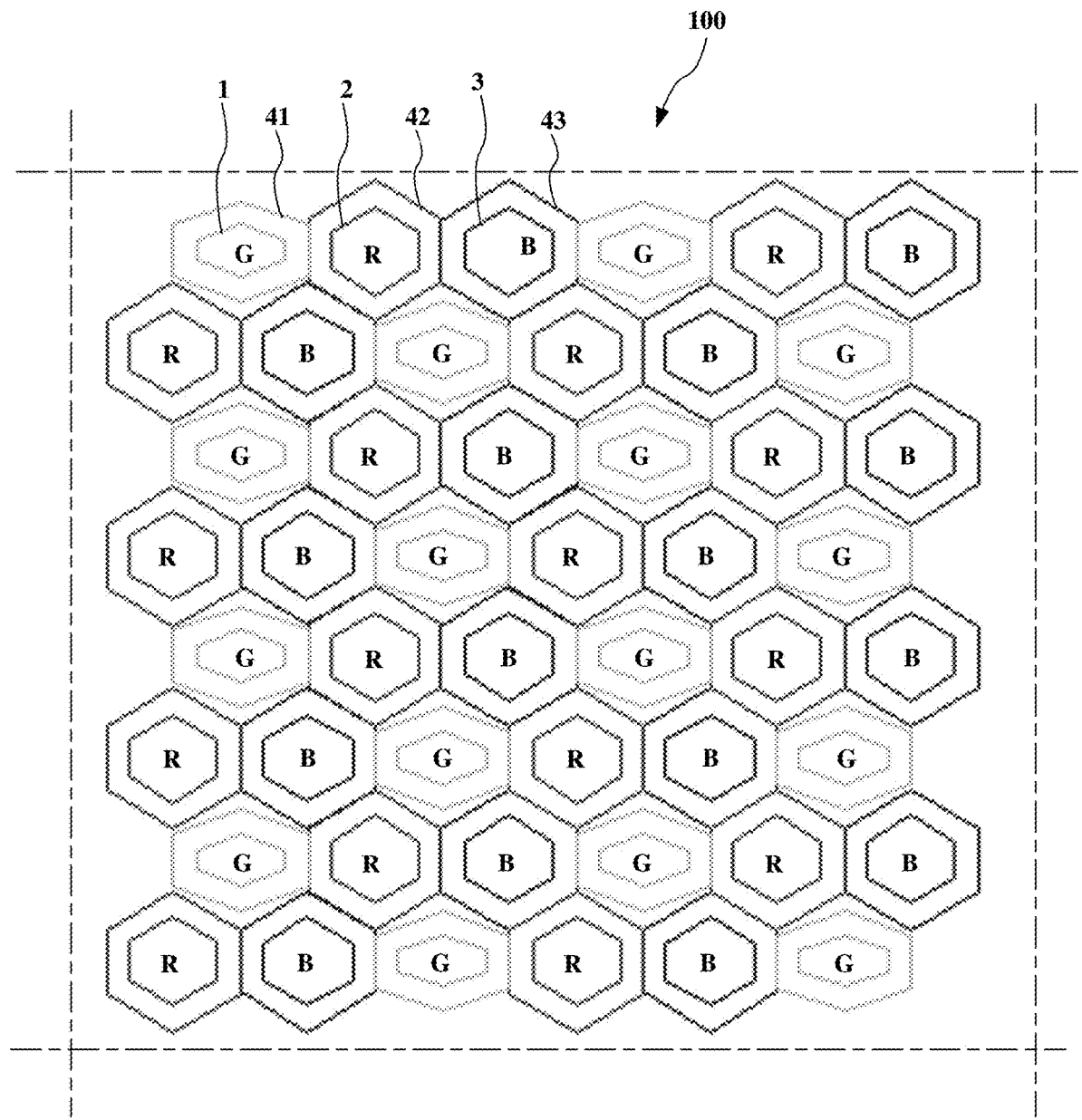
FIG. 2c is a schematic view of arrangements of sub-pixels and organic light-emitting layers of an organic light-emitting display substrate according to an embodiment of the present disclosure.
Figure 3B:
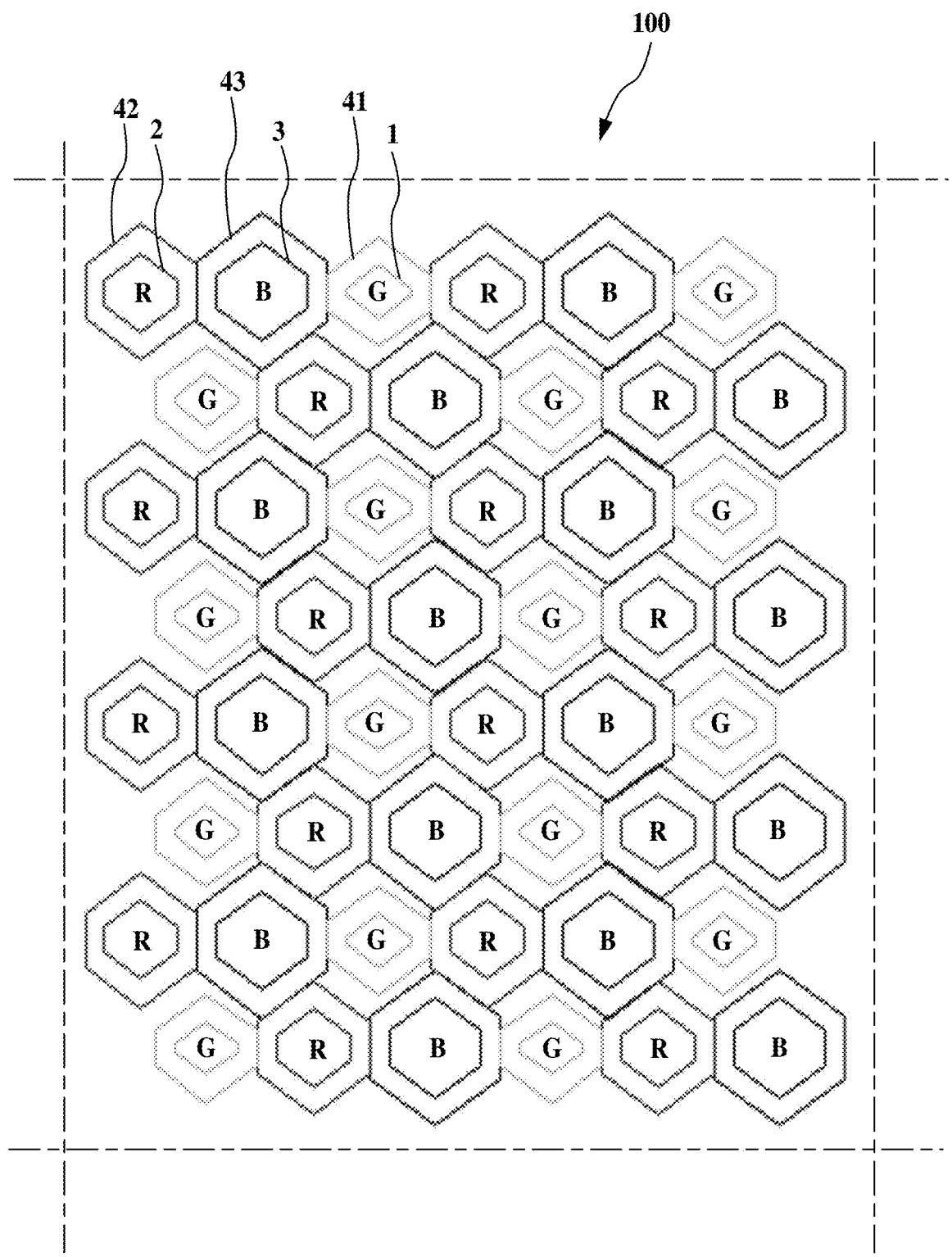
FIG. 3b is a schematic view of arrangements of sub-pixels and organic light-emitting layers of an organic light-emitting display substrate according to another embodiment of the present disclosure.

In the above-described embodiments of the present disclosure, organic light-emitting layers of the first sub-pixels 1, the second sub-pixels 2, and the third sub-pixels 3 can be separately prepared by mask evaporation. As shown in FIG. 2c and FIG. 3b, when the organic light-emitting layers 41, 42, and 43 of the organic light-emitting display substrate 100 are manufactured, first, the organic light-emitting layers 41 corresponding to the first sub-pixels 1 are formed through a first evaporation process, then, the organic light-emitting layers 42 corresponding to the second sub-pixels 2 are formed through a second evaporation process, and then, the organic light-emitting layers 43 corresponding to the third sub-pixels 3 are formed through a third evaporation process, wherein one separate mask plate is required in each of the three evaporation processes. Each organic light-emitting layer and its corresponding sub-pixel have same shapes and their geometric centers coincide, but they can have different sizes, and an edge of the organic light-emitting layer can be located outside an edge of its corresponding sub-pixel.

Compared with the related art, the pixel design solution according to the embodiment of the present disclosure only makes some adjustments on the size and shape design of the sub-pixels, but does not increase the screen-spreading difficulty of the mask plate. And no additional process is added in the manufacturing of the organic light-emitting display substrate. Therefore, the above embodiment of the present disclosure does not cause increased manufacturing cost.

Figure 4:
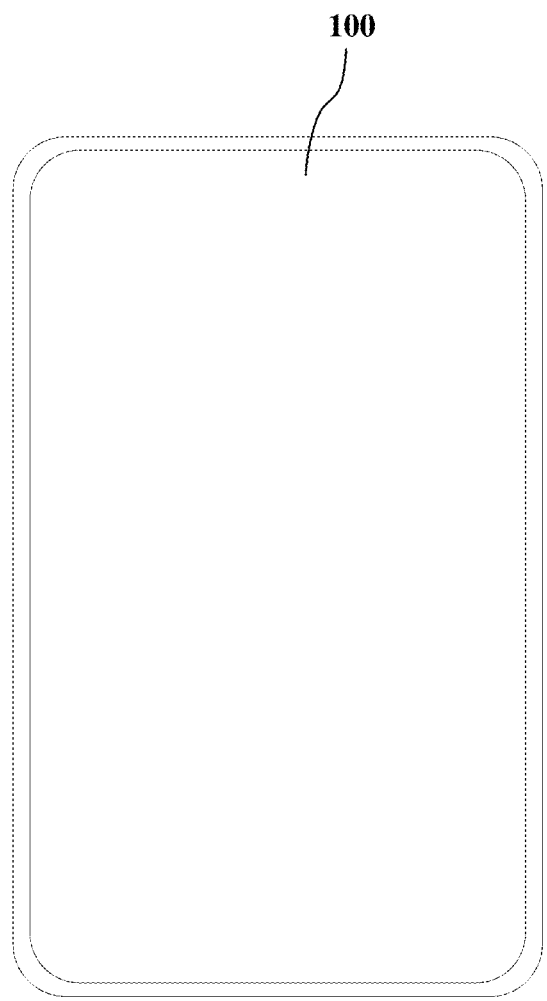
FIG. 4 is a front view of a display device according to an embodiment of the present disclosure.

As shown in FIG. 4, an embodiment of the present disclosure further provides a display device, which comprises the organic light-emitting display substrate 100 according to any of the foregoing embodiments. Compared with the related art, when a white pattern is displayed on the display device, the serrated edge of the pattern is effectively improved, and thus, display quality is significantly enhanced. Product types of the display device are not limited, and can be a flat panel display device, or a flexible display device, and specific products can be a display, electronic paper, a tablet computer, a television set, an intelligent display label, an intelligent display card, and the like.

Although some specific embodiments of the present disclosure have been described in detail by way of example, it should be understood by those skilled in the art that the above examples are for illustration only and are not intended to limit the scope of the present disclosure. It will be appreciated by those skilled in the art that modifications can be made to the above embodiments without departing from the scope and spirit of the present disclosure. The scope of the present disclosure is defined by the appended claim.

What is claimed is:

1. An organic light-emitting display substrate comprising a plurality of rows of sub-pixels, each of which comprises first sub-pixels, second sub-pixels and third sub-pixels repeatedly arranged, and two adjacent rows of sub-pixels are arranged in a staggered manner, wherein in every two adjacent rows of sub-pixels:
   a first sub-pixel in one row of sub-pixels and two sub-pixels in a row of sub-pixels adjacent to the first sub-pixel form a pixel unit, the two sub-pixels comprise a second sub-pixel and a third sub-pixel, and white light brightness centers of the pixel units in a same row are located on a same straight line.

2. The organic light-emitting display substrate according to claim 1, wherein:
   a longitudinal centerline of the first sub-pixel, a longitudinal centerline of the second sub-pixel and a longitudinal centerline of the third sub-pixel do not coincide with each other; and
   there is a non-overlapping portion between an orthographic projection of the first sub-pixel in a row direction and an orthographic projection of the second sub-pixel in the row direction, and a non-overlapping portion between the orthographic projection of the first sub-pixel in the row direction and an orthographic projection of the third sub-pixel in the row direction.

3. The organic light-emitting display substrate according to claim 2, wherein the longitudinal centerline of the first sub-pixel coincides with a center vertical line of a line segment between a center of the second sub-pixel and a center of the third sub-pixel.

4. The organic light-emitting display substrate according to claim 1, wherein the first sub-pixels are green light sub-pixels, the second sub-pixels are red light sub-pixels, and the third sub-pixels are blue light sub-pixels.

5. The organic light-emitting display substrate according to claim 1, wherein the first sub-pixels are green light sub-pixels, the second sub-pixels are blue light sub-pixels, and the third sub-pixels are red light sub-pixels.

6. The organic light-emitting display substrate according to claim 4, wherein when light mixing of the first sub-pixel, the second sub-pixel, and the third sub-pixel according to a brightness ratio of 30%:65%:5% is performed, the pixel unit overall exhibits white light.

7. The organic light-emitting display substrate according to claim 4, wherein:
   connection lines between a brightness center of the first sub-pixel, a brightness center of the second sub-pixel and a brightness center of the third sub-pixel is in a shape of an isosceles triangle; and
   the brightness center of the first sub-pixel is located at a vertex angle vertex of the isosceles triangle, the brightness center of the second sub-pixel and the brightness center of the third sub-pixel are respectively located at two base angle vertexes of the isosceles triangle, and a vertex angle of the isosceles triangle is greater than 60°.

8. The organic light-emitting display substrate according to claim 4, wherein the white light brightness center of the pixel unit is located at a midpoint of the connection line between a brightness center of the first sub-pixel and a brightness center of the second sub-pixel.

9. The organic light-emitting display substrate according to claim 1, wherein areas of the first sub-pixel, the second sub-pixel, and the third sub-pixel are equal.

10. The organic light-emitting display substrate according to claim 9, wherein:
   an orthographic projection length of the first sub-pixel in a row direction is greater than that in a column direction;
   an orthographic projection length of the second sub-pixel in the row direction is equal to that in the column direction; and
   an orthographic projection length of the third sub-pixel in the row direction is equal to that in the column direction.

11. The organic light-emitting display substrate according to claim 1, wherein an area $S_G$ of the first sub-pixel, an area $S_R$ of the second sub-pixel, and an area $S_B$ of the third sub-pixel satisfy $S_B > S_R > S_G$.

12. The organic light-emitting display substrate according to claim 11, wherein a distance between a longitudinal centerline of the first sub-pixel and a longitudinal centerline of the second sub-pixel is different from a distance between the longitudinal centerline of the first sub-pixel and a longitudinal centerline of the third sub-pixel.

13. The organic light-emitting display substrate according to claim 11, wherein:
   an orthographic projection length of the first sub-pixel in a row direction is greater than that in a column direction;
   an orthographic projection length of the second sub-pixel in the row direction is equal to that in the column direction; and
   an orthographic projection length of the third sub-pixel in the row direction is less than that in the column direction.

14. The organic light-emitting display substrate according to claim 1, wherein a shape of the sub-pixels comprises a rectangle, diamond, or hexagon.

15. The organic light-emitting display substrate according to claim 1, wherein:
   the first sub-pixels, the second sub-pixels and the third sub-pixels all comprise organic light-emitting layers;
   each sub-pixel and corresponding organic light-emitting layer thereto have a same shape and coincident geometric centers; and
   an edge of each sub-pixel is located inside an edge of the corresponding organic light-emitting layer thereto.

16. A method of preparing an organic light-emitting display substrate, comprising:
   forming a plurality of rows of sub-pixels, wherein each row of sub-pixels comprises first sub-pixels, second sub-pixels and third sub-pixels repeatedly arranged, and two adjacent rows of sub-pixels are arranged in a staggered manner, wherein in every two adjacent rows of sub-pixels:
   a first sub-pixel in one row of sub-pixels and two sub-pixels adjacent to the first sub-pixel in a row of sub-pixels form a pixel unit, the two sub-pixels comprise a second sub-pixel and a third sub-pixel, and white light brightness centers of the pixel units in a same row are located on a same straight line.

17. The method of preparing an organic light-emitting display substrate according to claim 16, wherein the first sub-pixels, the second sub-pixels and the third sub-pixels all comprise organic light-emitting layers, and the forming a plurality of rows of sub-pixels comprises:
   preparing organic light-emitting layers of the first sub-pixels, the second sub-pixels, and the third sub-pixels by using mask evaporation.

18. The method of preparing an organic light-emitting display substrate according to claim 17, wherein that preparing organic light-emitting layers of the first sub-pixels, the second sub-pixels, and the third sub-pixels by using mask evaporation comprises:
   forming organic light-emitting layers corresponding to the first sub-pixels by using a first evaporation process, forming organic light-emitting layers corresponding to the second sub-pixels by using a second evaporation process, and forming organic light-emitting layers corresponding to the third sub-pixels by using a third evaporation process, wherein a separate mask plate is used in each of the first evaporation process, the second evaporation process and the third evaporation process.

19. A display device comprising: the organic light-emitting display substrate according to claim 1.

* * * * *